United States Patent
Peizerat

(10) Patent No.: US 7,541,964 B2
(45) Date of Patent: Jun. 2, 2009

(54) ANALOGUE/DIGITAL CONVERTER MICROELECTRONIC DEVICE FOR EQUALISING CHARGES

(75) Inventor: Arnaud Peizerat, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 19 days.

(21) Appl. No.: 11/749,479

(22) Filed: May 16, 2007

(65) Prior Publication Data

US 2007/0285300 A1 Dec. 13, 2007

(30) Foreign Application Priority Data

May 24, 2006 (FR) .................................. 06 04718

(51) Int. Cl.
*H03M 1/12* (2006.01)
(52) U.S. Cl. .................... 341/172; 341/169; 341/143
(58) Field of Classification Search ................. 341/155, 341/122, 134, 172, 169, 143; 324/678
See application file for complete search history.

(56) References Cited

U.S. PATENT DOCUMENTS

| | | | |
|---|---|---|---|
| 4,057,796 A | | 11/1977 | Hoogendoorn et al. |
| 4,277,694 A | * | 7/1981 | Jensen .......................... 377/60 |
| 5,325,065 A | * | 6/1994 | Bennett et al. ............... 324/661 |
| 5,461,425 A | | 10/1995 | Fowler et al. |
| 6,130,713 A | | 10/2000 | Merrill |
| 6,538,593 B2 | | 3/2003 | Yang et al. |
| 7,288,946 B2 | * | 10/2007 | Hargreaves et al. ......... 324/678 |
| 2007/0176108 A1 | * | 8/2007 | Such et al. ............. 250/370.09 |
| 2007/0285300 A1 | | 12/2007 | Peizerat |

FOREIGN PATENT DOCUMENTS

| | | |
|---|---|---|
| FR | 2 330 213 | 5/1977 |
| FR | 2 888 074 | 1/2007 |

OTHER PUBLICATIONS

B. Pain, et al. "Approaches and analysis for on-focal-plane analog-to-digital conversion", SPIE Infrared Readout Electronics II, vol. 2226, 1994, pp. 208-218.
G. Mazza, et al., "A 64-Channel Wide Dynamic Range Charge Measurement ASIC for Strip and Pixel Ionization Detectors", IEEE Transactions on Nuclear Science, vol. 52, No. 4, XP-011137748, Aug. 2005, pp. 847-853.
Lisa G. McIlrath, "A Low-Power Low-Noise Ultrawide-Dynamic-Range CMOS Imager with Pixel-Parallel A/D Conversion", IEEE Journal of Solid-State Circuits, vol. 36, No. 5, May 2001, pp. 846-853.
David X. D. Yang, et al., "A 128×128 Pixel CMOS Area Image Sensor with Multiplexed Pixel Level A/D Conversion", IEEE 1996 Custom Integrated Circuits Conference, pp. 303-306.
U.S. Appl. No. 11/993,756, filed Dec. 21, 2007, Peizerat, et al.

* cited by examiner

*Primary Examiner*—Peguy JeanPierre
(74) *Attorney, Agent, or Firm*—Oblon, Spivak, McClelland, Maier & Neustadt, P.C.

(57) ABSTRACT

The disclosure relates to a microelectronic image sensor device comprising: at least one detector formed by at least one photo-detector element, at least one integration capacitor associated to the photo-detector and capable of providing at least one analogue signal capable of varying at least according to a current provided by the detector, and analogue/digital conversion means for equalising charges comprising: a comparator, injector means capable of modifying the analogue signal by one or more injections, respectively of a given quantity of charge, into the capacitor, command means for charge injector means capable of modulating the given quantity of charge injected according to the intensity of said current.

31 Claims, 5 Drawing Sheets

ANALOGUE/DIGITAL CONVERTER MICROELECTRONIC DEVICE FOR EQUALISING CHARGES

TECHNICAL FIELD

The invention relates to the field of microelectronic imaging sensors or image sensors, especially using CMOS technology. The invention relates to a microelectronic device equipped with one or more pixels, comprising respectively, a detector and an analogue/digital converter, especially asynchronous and with modulable charge injection.

The invention also relates to a method for commanding such a device. The invention permits in particular to obtain improved conversion dynamics.

PRIOR ART

A microelectronic imaging device or image sensor is generally formed by a matrix of pixels and an electronic control device. Each pixel comprises a detector, equipped for example with at least one photodiode or at least one phototransistor, provided to convert the energy of the incident photons on the pixel into electrons-hole couples, with an integration capacity, whose role is to stock these charges, as well as one or more transistors. At the output, the pixel matrix supplies an analogue signal, which the command device can convert into a digital signal. The analogue/digital conversion may possibly be carried out inside the chip in which the pixel matrix is integrated.

The document U.S. Pat. No. 5,461,425 presents an imager equipped with a pixel matrix supplying analogue signals and a plurality of analogue/digital converters integrated onto a same integrated circuit chip as the pixel matrix, wherein each analogue/digital converter is associated to one or more pixels, for example to a group of 4 pixels. A microelectronic digitising device revealed in this document is illustrated in FIG. 1. This digitising device is formed by a synchronous modulator $\Delta\Sigma$ 2, comprising an integration capacitor 1 designed to receive the charges, in the form of a current Idet, issued from the photo-detector, a comparator 3 driven by a clock 4. The comparator 3 commands a charge injector 6 connected to an output of the comparator 3 and designed to inject charge packets into the capacitor 1, as an input to the comparator 3. The modulator $\Delta\Sigma$ 2 issues a bit stream which may be filtered using a digital filter 8, for example a decimating filter located outside of a chip into which the pixel matrix and the digitising device are integrated. Such a digitising device typically has good linearity, but in general only allows a relatively low resolution to be achieved.

The document of L. G. McIlrath: "A Low Power Low-Noise Ultrawide-Dynamic Range CMOS Imager With Pixel-Parallel A/D Conversion", IEEE, JSSCC, vol. 36, n°5, Mai 2001, discloses a variant of the digitising device integrated into a pixel of an imager, equipped with an asynchronous modulator $\Delta\Sigma$ 5, is illustrated in FIG. 2. This modulator $\Delta\Sigma$ 5 comprises a comparator 3, which commands a reset switch 7 at a reference voltage Vref. The modulator $\Delta\Sigma$ 5 issues a bit stream which may also be transmitted to a digital filter 8 (FIG. 2). Such a device permits a very high dynamic to be obtained, for example of around 15 to 17 bits. In return, the digitising carried out depends on the linearity of the integration capacity 1 and has insufficient linearity notably when the detection current Idet issued from the photo-detector is high.

Another type of analogue digital converter device, called a "charge balancing" device, integrated into an imager is described in the document: "A 64-channel wide dynamic range charge measurement ASIC for strip and pixel ionization detectors", Mazza and al., IEEE, trans. On nuclear science vol. 52 n°4 August 2005. This device comprises an integration capacitor 10 at the output of a detector 11 that is connected to an input of a comparator 13, as well as a charge injector 19. One operating mode of this digitising device is illustrated in FIG. 4A showing examples of Scomp signals at the output of the comparator 13 and Vint at the input of the comparator 13, especially for a detection current Idet belonging to a first range of currents called "low" and/or such as $I_{DET}\tau<Q_O$, where $\tau$ is a delay constant of the switching of the comparator 13 and Qo is the quantity of fixed charge likely to be channelled into the capacitor 10 by the injector 19. In this operating mode, when the integration capacitor 10 receives charges from the detector, the voltage Vint or the analogue signal Vint varies, for example it decreases (such a variation is illustrated for example by a portion of the decrease curve 21 in FIG. 4A). The size of this variation, depends on the intensity of the detection current Idet. Then, following on from this variation, the analogue signal or the voltage Vint reaches a certain threshold, for example it passes below a threshold voltage Vthreshold of the comparator 13. After a delay time referenced $\tau$ once the threshold Vseuil has been reached, the signal Scomp at the output of the comparator 13 switches. During this switch, the signal Scomp at the output of the comparator 13 passes from a first state called a "stable" state, for example a high state, to a second state, for example a low state. Such a switch is shown, for example by a front descending edge 23 in FIG. 4A. The change of state of the signal Scomp triggers an injection, by the injector 19, of a quantity of fixed charges $Q_0$. Such an injection of charge may cause for example an increase in the signal Vint (vertical portion of the curve referenced 24 in FIG. 4A) of a value of around $Q_o/C$. In FIG. 4A, the increase in the signal Vint caused by the injection, is such that this signal Vint reaches a value higher than the threshold voltage of the comparator 13 and that is sufficient to permit the output of the comparator to switch again or at the signal Scomp to pass from the second state to the first state (front edge reference 25) or to switch to the stable state. In this first operating mode, the signal Scomp at the output of the comparator 13 returns to its stable state or switches back to the first state after each charge injection. The number of injections that the injector 19 performs to balance the charges issued from the detector 11 enables a digital value to be attributed which is representative of the quantity of total charges issued from the detector 11.

With such a device, the digitising is sensitive to the rapidity of the comparator 13, which can, if it is too slow, for example if the time constant $\tau$ is such that: $\tau>(Q_o/I_{DET})$, block a digitising in progress. Such a blockage is illustrated in FIG. 4B (portion 31 of the curve which represents the output signal Scomp of the comparator blocked in the second state or in the low state).

There is however the problem of finding a new analogue-digital conversion device integrated into a pixel of an imager that has both good linearity and a good conversion dynamic, and that does not have the disadvantages mentioned above.

DESCRIPTION OF THE INVENTION

The invention relates firstly to a microelectronic device comprising: at least one detector formed, of at least one integration capacitor associated to the detector and capable of providing at least one analogue signal that is likely to vary at least according to a current supplied by the detector, and analogue/digital conversion means comprising:

a comparator capable of receiving an analogue signal from the integration capacitor and of supplying an output signal likely to adopt two states, according to the analogue signal, a first state called the "stable state" or a second state, charge injector means capable of modifying the analogue signal by at least one injection of a given quantity of charges Qc into said capacitor following a change of state at the output of said comparator, from the first state to the second state, command means for the charge injector means, wherein the command means are capable of modulating the given quantity of charge Qc according to the intensity of said current.

The microelectronic device may be an image sensor. The detector may be formed by at least one photo-detector element.

The command means of the charge injector means may be provided to receive the two-states signal.

The invention permits a wider conversion dynamic to be obtained.

The invention avoids having to provide for, before or during the acquisition of an image, which range light intensity or which calibre has to be used.

In one possible embodiment, the charge injector means may be formed by a plurality of charge injectors.

In one variant, the charge injector means may be in the form of at least one transistor commanded by a voltage. In this variant, the command means of the injector means are likely to modulate the given quantity of charge Qc by varying said voltage applied to said transistor.

In another variant, the injector means are likely to inject a fixed quantity of current I into the integration capacitor in a variable duration Tinj of injection, such that Qc=I*Tinj.

In one possible embodiment of the microelectronic image sensor device, in which the charge injector means are formed by a plurality of charge injectors, during a succession of charge injections, command means may be provided to activate a first charge injector or a first plurality of charge injectors to carry out a first injection of charge of a given value, and to activate a different injector from the first injector or a plurality of injectors different from the first plurality of injectors, to make at least one other injection of charge of a value equal to said given value.

In one variant of the embodiment in which the charge injector means are formed by a plurality of charge injectors, and in which command means are provided so that, at each injection of charge of a series of charge injections, the command means activate at least one or more different injector(s) from the charge injector or charge injectors activated during the previous charge injection.

The invention can also permit the effects of technological dispersions to be limited.

In one possible embodiment, the injector means may be formed by a plurality of identical injectors, respectively capable of injecting a fixed quantity of elementary charge Qo.

The microelectronic image sensor device of the invention may possibly further comprise: counting means comprising a plurality of flip-flops, wherein the command means of the charge injector means, are capable of triggering, for each charge injection Qc, a modification of the output of at least one given flip-flop selected from said flip-flops, wherein said given flip-flop is selected according to the quantity of charges Qc injected.

In one possible embodiment, command means may be provided to adapt the quantity of charge Qc designed to be injected during at least one given charge injection, at least according to a frequency of charge injections made prior to said given charge injection.

In another possible embodiment, command means may be provided to adapt the quantity of charge Qc designed to be injected during at least one given charge injection, at least according to a minimum level of said analogue signal.

In one variant of the embodiment, the microelectronic image sensor device of the invention, may comprise means forming a monostable capable of:

identifying at least one change of state of the signal at the output of the comparator, from the first state to the second state, sending to the command means, following said change of state, one or more orders to trigger charge injections as long as the signal at the output of the comparator remains in the second state.

Such means permit to avoid a blockage of the conversion, especially when the detection current is high.

In a first possibility of this variant, command means may be provided moreover so that: if the number of trigger orders reaches a predetermined threshold and the signal at the output of the comparator remains in the second state, the quantity of charge Qc is increased at least for one further charge injection.

In a second possibility, which may be combined with the previous one, command means may be provided moreover so that: if the number of trigger orders following said change of state is less than or equal to a predetermined threshold when the signal at the output of the comparator switches back to the first state, the quantity of charge Qc is decreased at least for one further charge injection.

In the microelectronic image sensor device of the invention, analogue/digital converter means may not be fitted with a clock or may be asynchronous.

The invention also relates to a method for commanding a microelectronic device comprising at least one detector, at least one integration capacitor associated to the detector and capable of supplying at least one analogue signal likely to vary at least according to a current supplied by the detector, wherein the method comprises steps consisting of:

comparing the analogue signal to a predetermined reference and supplying a two-states signal representative of the comparison and likely to adopt a first state called the "stable state" or a second state, detecting, in said two-states signal, a transition from the first state to the second state, injecting, following said detection, one or more quantities of charges Qc into the integration capacitor, making at least one estimation of the current supplied by the detector, making a comparison of the result of said estimation to at least one predetermined threshold, injecting, following said comparison, one or more new given quantities of charges Qc into the capacitor, wherein said new given quantities of charges Qc are adapted according to the result of said comparison step.

In one possible embodiment of the method, said estimation of the current supplied by the detector may be made at least using one parameter of said analogue signal.

Said estimation may possibly be made at least according to a frequency of charge injections Qc.

In one variant, said estimation may be made at least according to the minimum level of the analogue signal.

In one possible embodiment, the method may comprise among others, following said change of state the step consisting of:

emitting, in the form of another two-states signal, one or more charge injection trigger orders as long as said two-states signal at the output of the comparator remains in the second state, wherein said estimation of the current supplied by the detector is made at least using a countdown of the number of trigger orders sent.

In one possible embodiment, if the number of trigger orders reaches a predetermined threshold while the signal at the output of the comparator remains in the second state, the method may further comprise: an increase in the quantity of charge for at least one following charge injection.

In another possible embodiment, if the given number of trigger orders following said change of state is less than or equal to a predetermined threshold when the signal at the output of the comparator switches back to the first state, the method may further comprise: a reduction in the quantity of charge injected for at least one following charge injection.

BRIEF DESCRIPTION OF THE DRAWINGS

This invention will be more clearly understood after reading the description of examples of embodiments supplied, provided purely as an example and in no way restrictively, in reference to the appended drawings in which.

The various parts shown in the figures are not necessarily to a same scale, in order to make the figures easier to read.

DETAILED DESCRIPTION OF SPECIFIC EMBODIMENTS

Figure 5:
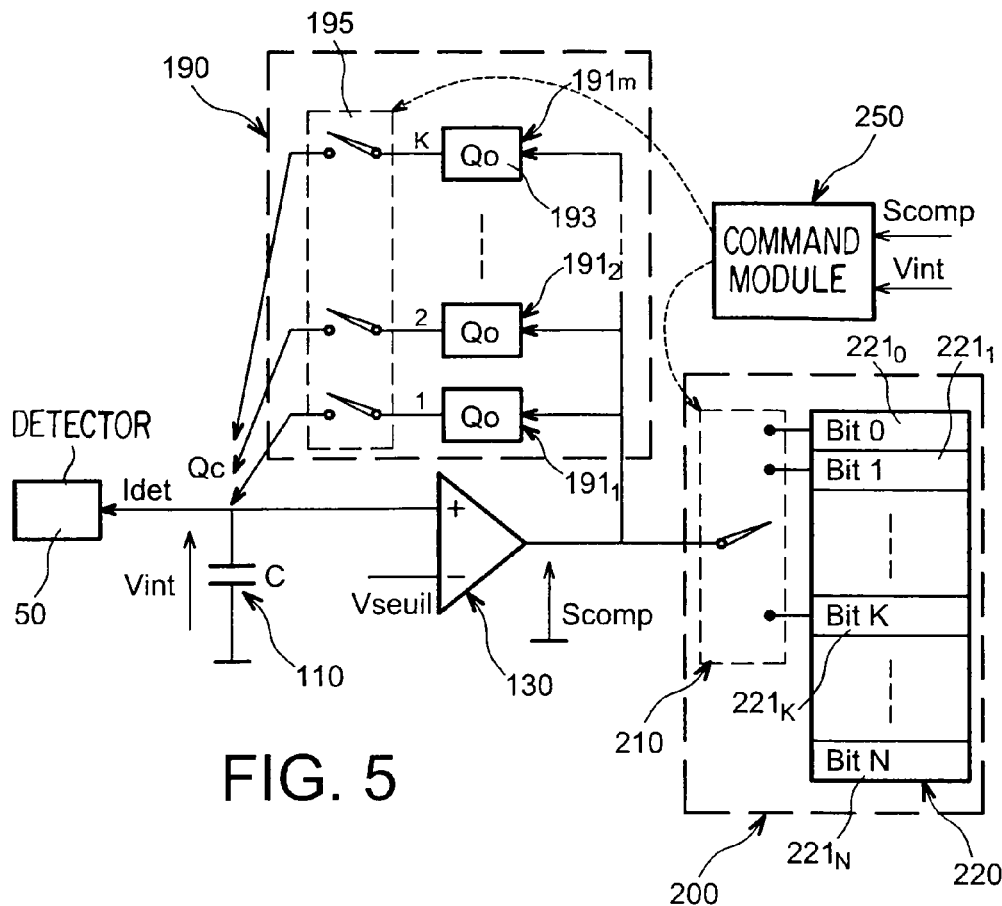
FIG. 5 illustrates an example of an analogue digital conversion device of the invention, integrated into a pixel of an imager, and equipped in particular with charge injector means, with modulable charge injection.

One example of a digitising device or analogue/digital conversion, of the invention, belonging to a microelectronic imaging device or image sensor, is illustrated in FIG. 5. The digitising device is associated to a detector 50 of a pixel of the device image sensor. The digitising device and the detector may be integrated into a same pixel and/or to a same chip and/or a same support and/or may belong to a same integrated circuit. In one variant, the detector may be assembled or hybridized on the digitising device.

The detector 50 may comprise at least one photo-detector element, for example at least one photodiode or at least one phototransistor (not shown in FIG. 5), provided to convert the incident photon energy on the pixel in electron-hole pairs. The photo-detector element may be provided to detect an electromagnetic radiation, which may for example be visible or X ray or infrared.

At the output of the detector 50, an integration capacitor 110 of capacity C, designed to receive charges issued by the detector 50 in the form of a detection current Idet, is provided. The current Idet issued from the detector 50 may be for example between 100 fA and 20 nA. At the terminals of the capacitor 110 an analogue signal in the form of a voltage Vint varies especially according to the detection current Idet, wherein the detection current Idet is itself dependent or a function of a luminous intensity or of a quantity of photons received by the detector 50.

The digitising device is of the "charge equalising" type and further comprises a comparator 130, charge injector means 190, counting means 200 at the output of the comparator 130, as well as a command module 250 for the charge injector means 190 and counting means 200.

The comparator 130 is designed to receive the analogue signal Vint on one of its inputs, and is provided to compare this signal Vint with a threshold voltage Vseuil. The result of this comparison is produced at the output of the comparator 130, in the form of a two states signal referenced Scomp, likely to adopt a first state called the "stable state", which may be for example a high state, or a second state which may be for example a low state. The comparator 130 may have a time constant τ for example of around 100 ns. The digital signal in two states Scomp is supplied in particular to the counting means 200.

The counting means 200 are located at the output of the comparator 130 and comprise means forming a switch or a switching device 210 as well as means forming a counter 220. The counter 220 may be formed by a plurality of flip-flops, for example by N flip-flops $221_0, 221_1, \ldots, 221_k, \ldots, 221_{N-1}$ (where k and N are integers). The switch 210 is provided to connect the output of the comparator 130 to at least one flip-flop selected from the plurality of flip-flops $221_0, 221_1, \ldots, 221_k, \ldots, 221_{N-1}$ The output of the counter 220 is designed to, indicate the result of the analogue-digital conversion. The outputs of the flip-flops $221_0, 221_1, \ldots, 221_k, \ldots, 221_{N-1}$ are respectively associated to one bit of a plurality of bits Bit 0, ..., BitN-1.

The charge injector means 190 are located between the output of the comparator 130 and the integration capacitor 110. These charge injector means 190 are capable, following a variation of the current Idet, of injecting a quantity of charges Qc or a series of quantities of charges Qc into the integration capacitor 110. Charge injector means 190 are provided to modify the analogue signal Vint by one or more injections, respectively by a given quantity of charges Qc, in the capacitor 110 following a change of state at the output of the comparator 130, from the first state to the second state. In this device, the quantity of charges also called "counter charge" Qc injected by the means 190 may be variable and adapted to suit the intensity of the current Idet. The counter charge Qc is preferably such that: Qc>Idet*τ.

The charge injector means 190 may be in the form of a plurality of m (where m>0) charge injectors $191_1, \ldots, 191_m$ respectively comprising: charge storage means 193 associated to means forming a switch 195. In this case, the counter charge Qc is the sum of the charges issued from the injectors selected from said plurality of injectors $191_1, \ldots, 191_m$. In one possible embodiment, the charge injector means 190 may be equipped with a number $m=2^k$ (where k is an integer not equal to zero) of charge injectors, activated so that the different counter charge values Qc designed to be injected, are capable of following a binary progression or in $2^i$ (where i is an integer). Charge injector means 190 may be formed by a plurality of charge injectors $191_1, \ldots, 191_m$, identical to one another. Charge storage means 193 may be suitable, respectively, for storing a fixed quantity of elementary charge $Q_0$ when the switch means 195 to which these storage means 193 are associated, are blocked or open or in a state called "deactivated". The fixed elementary charge $Q_0$, may be for example around 2000 holes or 0.32 fC. The charge storage means 193 are respectively capable of providing the quantity of fixed elementary charge $Q_0$ when the respective switch means 195 to which these storage means 193 are associated, are open or closed or in an "activated" state. The injector means 190 may modify the signal Vint, by providing a counter charge $Qc=p*Q_0$ (where p is a number not equal to zero of charge injectors that are activated or selected from the m charge injectors $191_1, \ldots, 191_m$) or possibly a series of several consecutive counter charges respectively equal to a quantity of charge $Qc=p*Q_0$, in the capacitor 110 at the input of the comparator 130. The quantity of charges or the counter charge Qc injected may be variable from one charge injection to another. The number p of charge injectors activated or selected from the m charge injectors $191_1, \ldots, 191_m$, may thus be variable from one charge injection to another. By "activated" injector we mean an injector providing a quantity of fixed charge $Q_0$ whose associated switch is activated or closed or open. The device is equipped with means to adapt the counter charge Qc issued from the charge injector means 190. This counter charge Qc may be adapted or modulated to suit the intensity of the current Idet issued from the detector 50. In one example, during a charge injection, the injector means may provide a quantity of charge Qc for example equal to $Q_0$, using an activated injector $191_1$, then, during the following injection, provide a quantity of charge Qc for example equal to $2*Q_0$, using two activated injectors $191_1, 191_2$.

To permit the effects linked to the technological differences between the different injectors $191_1, \ldots, 191_m$ to be reduced, the digitising device may be used so that the activated injectors change from one charge injection to another, or from one injection to the following injection. The device may be provided in particular so that, during a succession of charge injections, it activates a first charge injector or a first plurality of charge injectors to make a first charge injection of a given value, and to activate a different injector than the first injector or a plurality of injectors different from the first plurality of injectors, to make at least another charge injection of a value equal to said given value. Said first injection and said other injection may be successive. In one alternative the device may be used so that during one series of charge injections made by the injector means 190, at each charge injection, at least one charge injector or several charge injectors, or all the charge injectors, are different from that or those selected from the previous charge injection. In one example of operation, during a charge injection, the injector means 190 are capable of providing a quantity of charge Qc for example equal to $Q_0$, using a first activated injector $191_1$ then, during the following injection, of providing a quantity of charge Qc for example equal to $Q_0$, using a second activated injector $191_2$, that is different from the first injector $191_1$.

The command module 250 receives at its input, the two-states signal Scomp from the output of the comparator 130, as well as the signal Vint at the terminals of the integration capacitor 110. The selection for each injection, of the injector(s) $191_1, \ldots, 191_m$ designed to provide the counter charge Qc in the capacitor 110, is made by the command module 250. The command module 250 in particular may be used, for example using at least one offset register, to select, for an injection or for each injection made by the injector means 190, at least an injector that is different from the injectors or the injector selected during the previous injection. In this embodiment the command module 250 is also provided, to select for each injection, a number p of injectors adapted to suit the evolution of the signal Vint. The command module 250 may also be provided to control the switches of the switching device 210. For each charge injection, the command module 250 can make a selection, via the switch 210, of an input from the counter 220 from the counter inputs 220, to be connected to the output of the comparator 130. For each charge injection, the command module 250 is therefore capable of triggering a connection of an input of a flip-flop from the flip-flop inputs $211_0, 211_1, \ldots, 211_k, \ldots, 211_{N-1}$, at the output of the comparator 130. For a given charge injection, the selection of a flip-flop among the flip-flops $211_0, 211_1, \ldots, 211_k, \ldots, 211_{N-1}$, is made according to the value of the counter charge Qc provided for this given charge injection. The selection of one or more injectors may be made simultaneously to that of one or more flip-flops of the counting means 200. In one example of operation, when a single injector is activated from the plurality of injectors $191_1, 191_m$, a quantity of charges $Qc=Q_0$, is injected, while the output of the comparator 130 is connected to the first flip-flop $221_0$ of the counter 220 corresponding to the $1^{st}$ bit Bit 0 of said plurality of bits Bit 0 , . . . , Bit N- 1 . When two injectors are activated from the plurality of injectors $191_1, \ldots, 191_m$ a quantity of charges $Qc=2*Q_0$, is injected, while the output of the comparator 130 is connected to the second flip-flop $221_1$ of the counter 220 corresponding to the $2^{nd}$ bit, Bit 1 of said plurality of bits Bit 0, . . . , Bit N-1. When k injectors are activated from the plurality of injectors $191_1, \ldots, 191_m$, a quantity of charges $Qc=2^k*Q_0$, is injected, while the output of the comparator 130 is connected to the $(k+1)^{th}$ flip-flop $221_k$ of the counter 220. The command module 250 is thus capable of triggering, for each charge injection, a modification of the output of at least one given flip-flop selected from said flip-flops, wherein the given flip-flop is selected according to the value of the counter charge Qc injected.

At the end of a conversion, the counter 220 contains the digital value of the quantity of charge received at the input of the device or the current Idet. The accuracy or least significant bit of the counter 220 is determined according to the value of the last counter charge Qc injected during said conversion. In one case for example, where the last injection made during a conversion is equal to $Q_0$, the N bits bit 0, . . . , bit N-1 of the counter 220 are significant. In another case for example, where the last injection made during a conversion is equal to $2*Q_0$, N-1 bits of the counter 220 are significant. In another case for example, where the last injection made during a conversion is equal to $(2^k)*Q_0$, N-K bits of the counter 220 are significant.

In one example of the embodiment of the device and in particular the command means 250, the adaptation of the value of the counter charge Qc for an injection, may be made by this command module 250 according to the signal Vint and in particular the frequency F of the injections in this signal Vint. An estimation of the frequency F of the injections may permit an estimation of the current Idet issued from the detector to be made.

Figure 6A:
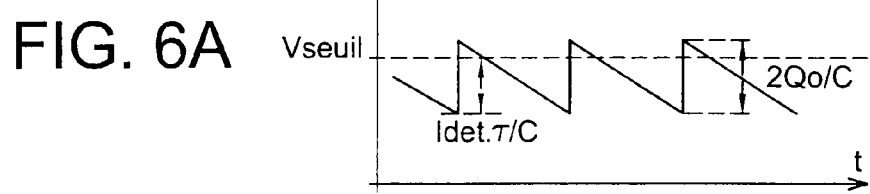
FIGS. 6A, 6B illustrate a modulation of the counter charge Qc injected by a charge injector charges of a digitising device of the invention.
Figure 6B:
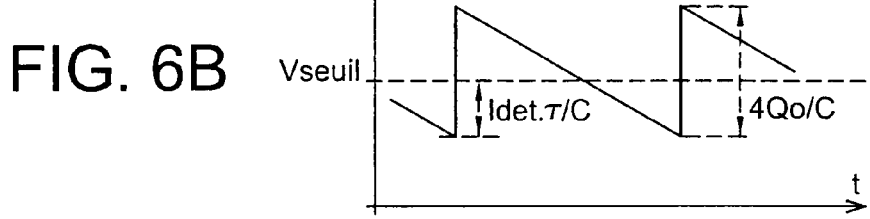

The command module 250 may be used so that when the frequency of the injections F exceeds a first predetermined threshold $F_{seuil\_haut}$, such that $F_{seuil\_haut} < 1/\tau$, the counter charge Qc is increased, for example doubled, at least for the following charge injection and possibly for the following charge injections. In one case, for example where the counter charge current injected is equal to $2*Q_0$ (FIG. 6A, wherein an example of the analogue signal Vint at the input of the comparator 130 is shown in this figure) and the frequency of the injections F reaches or exceeds the first given threshold $F_{seuil\_haut}$, the command module 250 may select two additional injectors for the following charge injection so that the next counter charge is equal to $4*Q_0$ (FIG. 6B, representative of the signal Vint at the input of the comparator 130). A second threshold may also be used so that when the frequency of the injections F reaches or drops below a second given threshold $F_{seuil\_bas}$, the counter charge Qc is reduced, for example halved. In one case for example where the counter charge current injected is equal to $4*Q_0$ (FIG. 6B) and the frequency of the injections F passes below the second given threshold $F_{bas}$, the command module 250 may select two injectors less for the following charge injection so that the following counter charge is equal to $2*Q_0$ (FIG. 6A).

In another example of the embodiment of the device and in particular the command means 250, the adaptation of the number p of injectors selected by the command module 250 or the value of the counter charge Qc injected, may be according to the value or the amplitude of the integration voltage Vint. The adaptation of the counter charge Qc may be made in particular according to the minimum Vmin reached by the integration voltage Vint following a discharge of the integration capacitor 110. The minimum value Vmin of the integration voltage Vint provides an indication to the command module 250 of the value of the product Idet*τ. An estimation of the minimum value Vmin of the integration voltage Vint may permit an estimation of the current Idet issued from the detector to be made, and permit the command module 250 to adapt the value of the following counter charge Qc to suit the value of the product Idet*τ.

The device of the invention is not limited to injector means formed by injectors that are identical to one another. Nor is the invention limited to counter charge values Qc which follow a progression in $2^i$. One variant of the device for which, for example counter charges $Qc = 3*Q_0$, are likely to be injected may also be provided. In such a variant, the counting means may comprise a counter whose increment is 3, and formed, for example, using at least one adder.

The microelectronic device of the invention is not limited to injector means formed by a plurality of injectors.

In one variant, the charge injector means may for example be in the form of a transistor commanded by a voltage, wherein the command means of the injector means are capable of modulating the quantity of charge Qc by modulating said voltage applied to said transistor.

In another variant, command means of the injector means may be provided at each injection, to inject a quantity of fixed current I to suit a variable duration Tinj of injection that may be modulated, such that Qc=I*Tinj.

Figure 1:
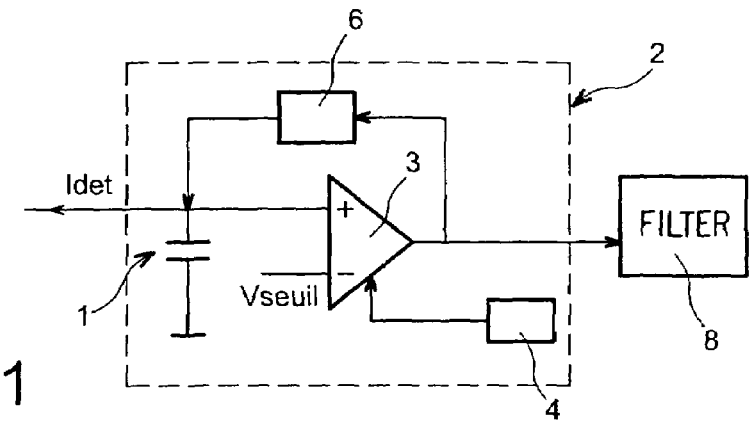
FIG. 1 illustrates a first example of the device of the prior art, equipped with a synchronous analogue digital converter and with charge injections, integrated into a pixel matrix of an imager or an image sensor.
Figure 2:
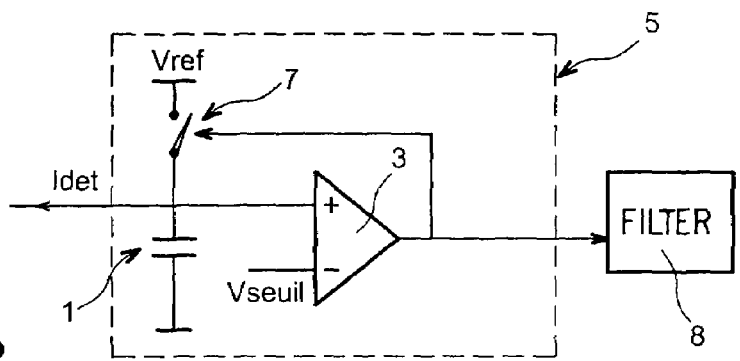
FIG. 2 illustrates a second example of device of the prior art, equipped with an asynchronous analogue digital converter, integrated into a pixel matrix of an imager or an image sensor.
Figure 3:
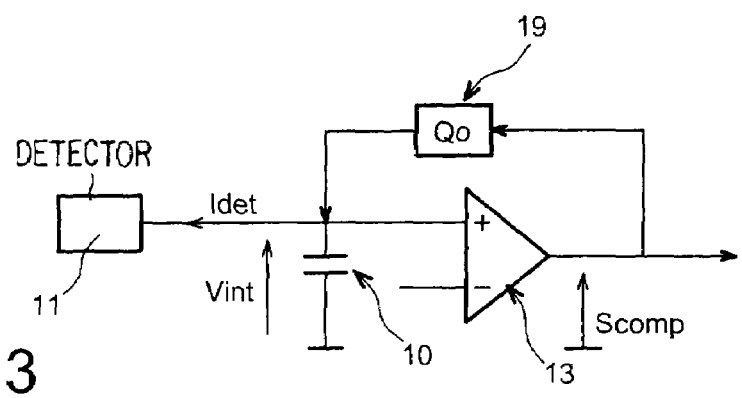
FIG. 3 illustrates a third example of device of the prior art, equipped with an asynchronous analogue digital converter and with charge injections, integrated into a pixel matrix of an imager or an image sensor, FIGS. 4A and 4B respectively illustrate, using input and output signals of a comparator that is part of the third example of the device of the prior art, normal operation of this device and blocking of a digitising embodiment with this device.
Figure 4A:
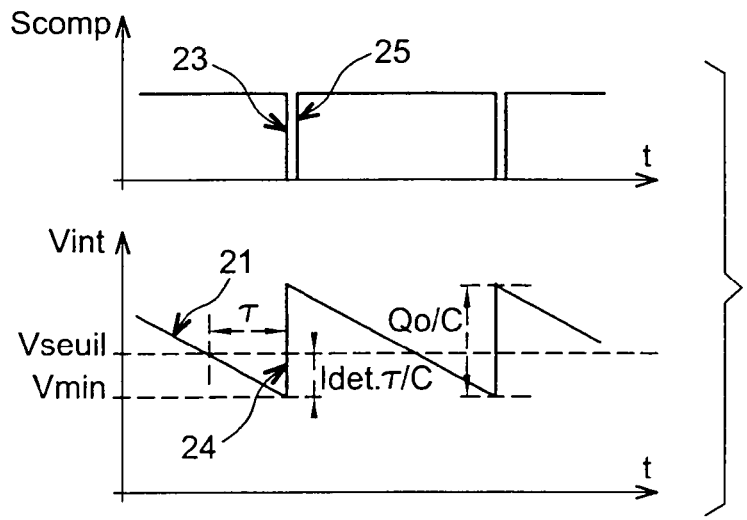
Figure 4B:
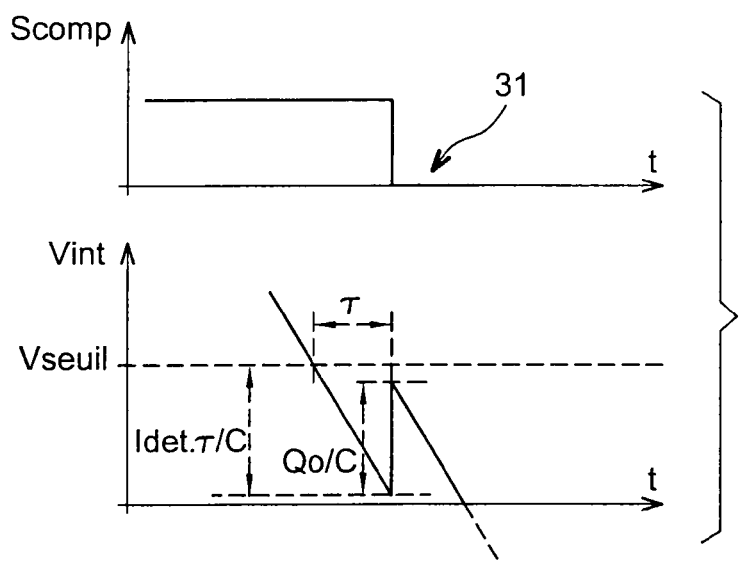
Figure 7:
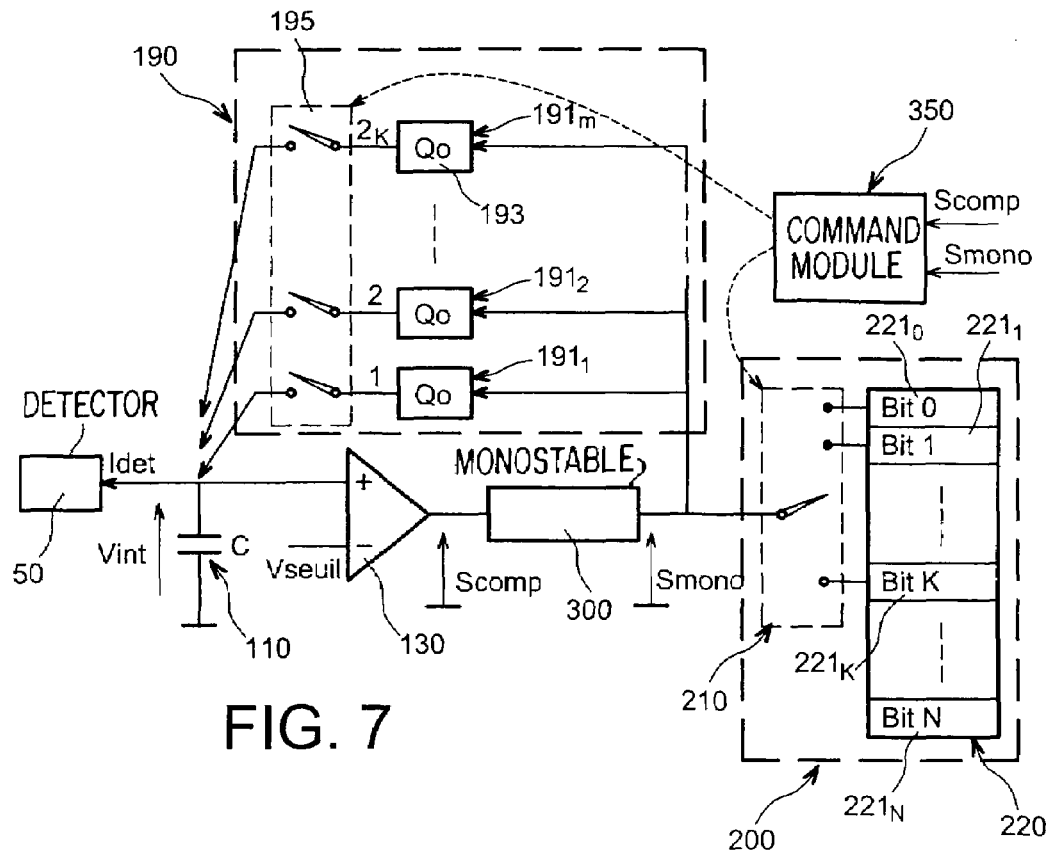
FIG. 7 illustrates another example of an analogue digital conversion device of the invention, integrated into a pixel of an imager, and equipped in particular with retriggering means designed to prevent blockage of the conversion device.

One variant of the digitising device of the invention previously described, is illustrated in FIG. 7. For this variant, the digitising device is equipped moreover with means forming a monostable 300 called "retriggering" located at the output of the comparator 130, between the latter and the counting means 250. The monostable 300 supplies a two-states signal Smono, and does not have a clock and/or asynchronous operation. Using the monostable 300, the digitising embodiment via the converter, is only slightly sensitive to the rapidity of the comparator 130 or to the delay τ for triggering the comparator 130, and permits to guard against a blockage as shown in FIG. 4B, of the output signal Scomp of the comparator, when the current $I_{DET}$ at the output of the detector is high. The monostable 300 may be formed for example by a flip-flop designed to receive the output signal Scomp from the comparator 130, of several delay cells, as well as one or more logic gates. The monostable 300 comprises in particular means for:

identifying a change of state of the signal Scomp at the output of the comparator 130, from a first state or stable state, for example a high state, to a second state or unstable state, for example a low state, emitting, via the signal Smono, following said change of state, one or more trigger instructions, or trigger commands, charge injections as long as the signal Scomp at the output of the comparator 130 remains in the second state or unstable state.

Figure 8:
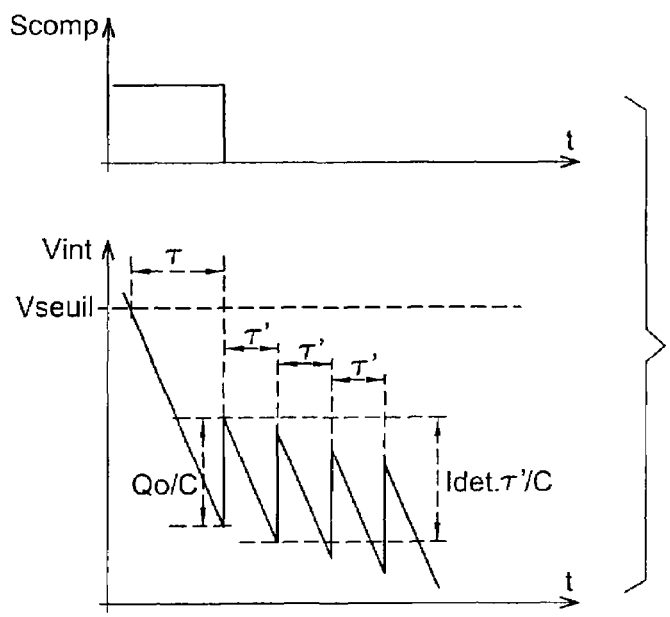
FIG. 8 illustrates an example of saturation, that the retriggering means of an analogue digital conversion device of the invention are likely to prevent.

For this variant, the command module 250 is replaced by another command module referenced 350. The command module 350 of this variant of device, receives at its input the output signal Scomp of the comparator 130, as well as the output signal Smono of the monostable 300. The command module 350 is provided to select, when it receives an injection trigger instruction or an injection trigger command from the monostable 300, the injector(s) $191_1, \ldots, 191_m$ designed to provide the quantity of charges Qc in the capacitor 110. The command module 350 is also capable of selecting for each injection of counter-charge Qc, an input from a flip-flop from the inputs of the flip-flops $211_0, 211_1, \ldots, 211_k, \ldots, 211_{N-1}$, to be connected to the output of the comparator 130, according to the planned value for this counter charge Qc. the monostable 300 has a time constant τ'. The time constant τ' may be for example around 60 nanoseconds and correspond to a minimum duration between two injection trigger instructions or between two injection trigger commands. The device of the invention is used to guard against saturation when Idet*τ'>$Q_0$, such a saturation is illustrated for example in FIG. 8.

To avoid saturation of the device, the command module 350 may be used to count down the number Xi of consecutive trigger instructions or trigger commands in the signal Smono, following a change of state, from the first state to the second state, of the signal Scomp at the output of the comparator 130.

An estimation of the number Xi of trigger instructions can permit an estimation of the current Idet issued from the detector to be made.

Too high a number Xi of consecutive trigger instructions or trigger commands can indicate to the command unit 350 that the counter charge Qc should preferably be increased, whilst too few a number Xi of consecutive trigger instructions or trigger commands can indicate to the command unit 350 that the counter charge Qc should preferably be reduced.

Following a change of state of the signal Scomp at the output of the comparator 130, from the first state to the second state, from the output signal Smono from the monostable 300, the command module 350 counts down the number Xi of prior consecutive trigger instructions or trigger commands. In a case where the number Xi of trigger instructions reaches a first predetermined threshold Seuil_max, for example 4 triggers, whilst the output signal Scomp of the comparator remains in the second state, the command module 350 increases the value of the counter charge Qc for the following charge injection.

In another case, where the number Xi of trigger orders consecutive to said change of state is less than or equal to a second predetermined threshold Seuil_min, for example for 1 trigger when the output signal Scomp of the comparator 130 switches back to the first state, the command module 350 reduces the value of the counter charge Qc for the following charge injection.

Figure 9:
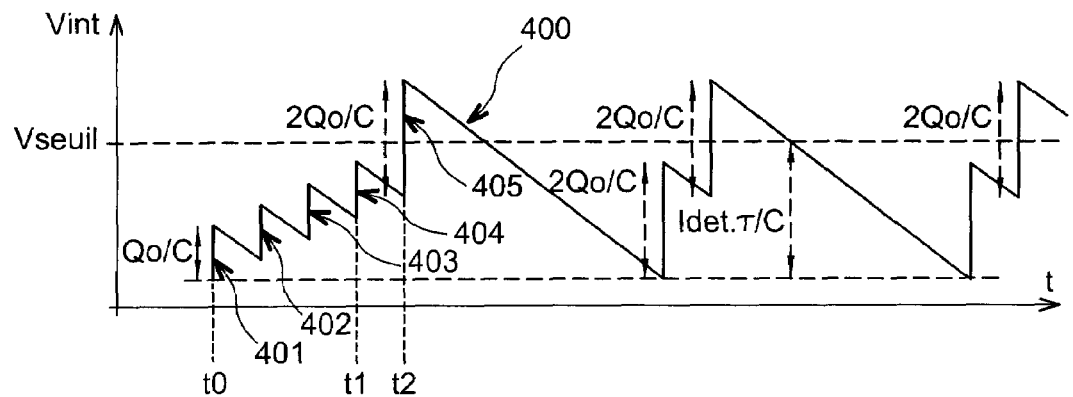
FIG. 9 illustrates an example of adaptation or modulation of the quantity of charges injected by the charge injector means in an analogue digital conversion device of the invention, integrated into at least one pixel of an imager.

One example of operation of the device previously described, used with a first trigger threshold Seuil_max=4, is illustrated in FIG. 9, via a curve 400 that is representative of an example of an analogue signal Vint at the terminals of the integration capacitor 110. Following a change of state (not shown) of the output signal of the comparator 130, from a first state or stable state, to a second state or unstable state, at a moment $t_0$, a first charge injection (portion referenced 401 of the curve 400) is made via the injector means 190 with a counter charge Qc equal to $Q_0$. Then, several other charge injections (portions respectively referenced 402, 403, of the curve 400) respectively equal to $Q_0$ are made after $t_0$, between the moment $t_0$ and a moment $t_1$, without the output of the comparator 130 returning to the stable state. At a moment $t_1$, a fourth charge injection (portion referenced 404 of the curve 400) is made with a counter charge Qc equal to $Q_0$. At the moment $t_1$, the voltage Vint is less than Vseuil, such that the output signal of the comparator 130 does not switch back and still remains in the second state. As the threshold Seuil_max=4 has been reached at the moment $t_1$, the command unit 350 increases the counter charge for the following injection. The following injection (portion referenced 405 of the curve 400) is made at a moment $t_2$, with an increased counter charge Qc that is equal to $2*Q_0$.

Figure 10:
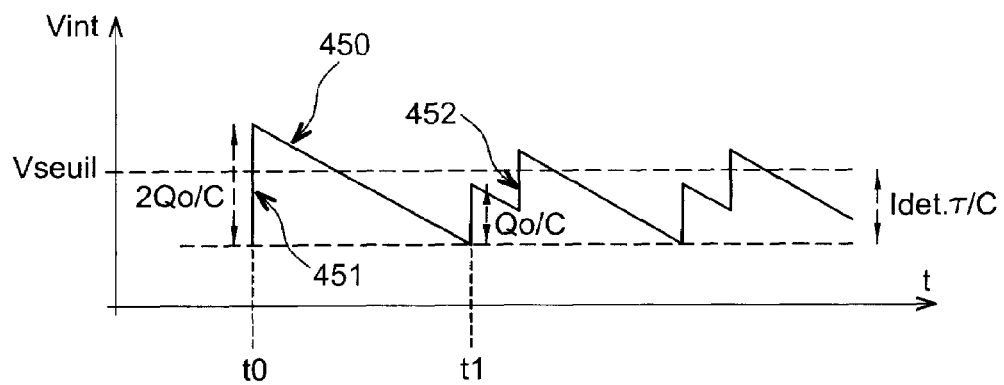
FIG. 10 illustrates another example of adaptation or modulation of the quantity of charges injected by the charge injector means in an analogue digital conversion device of the invention, integrated into at least one pixel of an imager, Identical, similar or equivalent parts of the various figures have the same digital references so as to make it easier to switch from one figure to another.

Another example of operation of the device previously described, used with a second trigger threshold Seuil_min=1, is illustrated in FIG. 10, via a curve 450 that is representative of an example of an analogue signal Vint at the terminals of the integration capacitor 110. Following a change of state (not shown) of the output signal of the comparator 130, from a first state or stable state, to a second state or unstable state, at a moment $t_0$, a first charge injection (portion referenced 451 of the curve 450) is made by the injector means 190 with a counter charge Qc equal to $2*Q_0$. The first charge injection at the moment $t_0$, is sufficient to switch the output signal Scomp of the comparator 130 back to the second state or stable state. Where the number Xi of injection commands emitted by the monostable 300 between said change of state prior to the moment $t_0$ and the moment when the output of the comparator 130 again returns to the stable state, is equal to the threshold Seuil_min, the command unit 350 reduces the counter charge for the following charge injection. Then, at a moment $t_1$, a second charge injection (portion referenced 452 of the curve 450) is made with a reduced counter charge Qc equal to $Q_0$.

As concerns the accuracy of the analogue digital conversion made by a device of the invention, in the case of the image being taken using a shutter for example for visible radiation detection or in the case where the source of the radiation detected is commanded, for example for a detection of X radiation, the invention permits an improved conversion dynamic to be obtained whilst conserving good accuracy.

In a case for example where the photo detector 50 is lit for a duration Δt, the latter produces a current Idet which may be high and which would require a change in the operating range of the image sensor. The injector means 190, in response to this high current Idet may then inject counter charges Qc equal for example to $8*Q_0$. Then, after the duration Δt, the photo detector 50 is no longer lit, so that the current Idet falls to a very low value, for example that of the obscurity current. The device then adapts the value of the counter charges injected Qc to the value of the fixed elementary charge $Q_0$. An accuracy of $Q_0$ may be achieved in spite of the change in range that has just been made.

The invention claimed is:

1. A microelectronic imaging device comprising at least one detector comprising a photodetector, at least one integration capacitor associated to the detector and adapted to provide at least one analogue signal that is variable at least according to a current supplied by the detector, and analogue/digital conversion means comprising:
a comparator adapted to receive an analogue signal from an integration capacitor and to provide a two-states output signal for adopting, according to the analogue signal, a first state called the "stable state" or a second state,
charge injector means for modifying the analogue signal by at least one injection of a given quantity of charge into the capacitor following a change of state at the output of the comparator, from the first state to the second state,
command means for controlling the charge injector means, wherein the command means are adapted to modulate the given quantity of charge according to the intensity of said current.

2. A microelectronic device according to claim 1, wherein charge injector means are formed by a plurality of charge injectors.

3. A microelectronic image sensor device according to claim 2, wherein command means are provided in order, at each charge injection of a series of charge injections, to activate at least one or more different injector(s) of the charge injector charge injectors activated during the previous charge injection.

4. A microelectronic device according to claim 2, wherein during a succession of charge injections, the command means are capable of activating a first charge injector or a first plurality of charge injectors to make a first charge injection of a given value, and of activating a different injector from the first injector or a plurality of injectors different from the first plurality of injectors, to make at least one other charge injection which value is equal to said given value.

5. A microelectronic device according to claim 4, in which injector means are formed by a plurality of identical injectors, respectively adapted to inject a fixed quantity of charge.

6. A microelectronic device according to claim 1, comprising moreover: counting means comprising a plurality of flip-flops, wherein the command means of the charge injector means, are adapted to trigger, for each charge injection, a modification of the output of at least one given flip-flop selected from said flip-flops, wherein said given flip-flop is selected according to the quantity of charges injected.

7. A microelectronic device according to claim 1, further comprising:
means forming a monostable for:
identifying at least one change of state of the signal at the output of the comparator, from the first state to the second state, emitting to the command means, following said change of state, one or more injection trigger orders as long as the signal at the output of the comparator remains in the second state.

8. A microelectronic device according to claim 1, the command means being adapted to receive the analogue signal, wherein command means are provided to adapt the quantity of charge to be injected during at least one given charge injection, at least according to a frequency of charge injections made prior to said given charge injection.

9. A microelectronic device according to claim 1, in which the command means are adapted to receive the analogue signal, wherein the command means are provided to adapt the quantity of charge designed to be injected during at least one given charge injection, at least according to the minimum level of the analogue signal.

10. A microelectronic device comprising: at least one detector, at least one integration capacitor associated to the detector and adapted to provide at least one analogue signal that is variable at least according to a current supplied by the detector, and analogue/digital conversion means comprising:
　a comparator for receiving an analogue signal from an integration capacitor and for providing a two-states output signal capable of adopting, according to the analogue signal, a first state called the "stable state" or a second state,
　charge injector means comprising several charge injectors adapted to modify the analogue signal by at least one injection of a given quantity of charge into the capacitor following a change of state at the output of the comparator, from the first state to the second state, the given quantity of charge injected changing according to the number of activated injectors,
　command means for controlling the charge injector means, wherein the command means are adapted to modulate the given quantity of charge according to the intensity of said current.

11. A microelectronic device according to claim 10, wherein command means are provided in order, at each charge injection of a series of charge injections, to activate at least one or more different injector(s) of the charge injector charge injectors activated during the previous charge injection.

12. A microelectronic device according to claim 10, wherein during a succession of charge injections, the command means are capable of activating a first charge injector or a first plurality of charge injectors to make a first charge injection of a given value, and of activating a different injector from the first injector or a plurality of injectors different from the first plurality of injectors, to make at least one other charge injection which value is equal to said given value.

13. A microelectronic device according to claim 10, the command means being adapted to receive the analogue signal, wherein command means are provided to adapt the quantity of charge to be injected during at least one given charge injection, at least according to a frequency of charge injections made prior to said given charge injection.

14. A microelectronic device according to claim 10, in which the command means are adapted to receive the analogue signal, wherein the command means are provided to adapt the quantity of charge to be injected during at least one given charge injection, at least according to the minimum level of the analogue signal.

15. A microelectronic device according to claim 10, said detector comprising a photodetector.

16. A microelectronic device comprising: at least one detector, at least one integration capacitor associated to the detector and adapted to provide at least one analogue signal that is variable at least according to a current supplied by the detector, and analogue/digital conversion means comprising:
　a comparator for receiving an analogue signal from an integration capacitor and of providing a two-states output signal capable of adopting, according to the analogue signal, a first state called the "stable state" or a second state,
　charge injector means are formed by a plurality of charge injectors, for modifying the analogue signal by at least one injection of a given quantity of charge into the capacitor following a change of state at the output of the comparator, from the first state to the second state,
　command means for the charge injector means, wherein the command means are for modulating the given quantity of charge according to the intensity of said current, command means being provided in order, at each charge injection of a series of charge injections, to activate at least one or more different injector(s) of the charge injector charge injectors activated during the previous charge injection.

17. A microelectronic device according to claim 16, in which the charge injector means are formed by a plurality of charge injectors, and in which during a succession of charge injections, the command means are capable of activating a first charge injector or a first plurality of charge injectors to make a first charge injection of a given value, and of activating a different injector from the first injector or a plurality of injectors different from the first plurality of injectors, to make at least one other charge injection whose value is equal to said given value.

18. A microelectronic device according to claim 16, in which injector means are formed by a plurality of identical injectors, respectively adapted to inject a fixed quantity of charge.

19. A microelectronic device according to claim 16, comprising moreover: counting means comprising a plurality of flip-flops, wherein the command means
　of the charge injector means, are adapted to trigger, for each charge injection, a modification of the output of at least one given flip-flop selected from said flip-flops, wherein said given flip-flop is selected according to the quantity of charges injected.

20. A microelectronic image sensor device of claim 16, further comprising means forming a monostable for:
　identifying at least one change of state of the signal at the output of the comparator, from the first state to the second state,
　emitting to the command means, following said change of state, one or more injection trigger orders as long as the signal (Scamp) at the output of the comparator remains in the second state.

21. A microelectronic device comprising: at least one detector formed by at least one photo-detector element, at least one integration capacitor associated to the detector and adapted to provide at least one analogue signal that is variable at least according to a current supplied by the detector, and analogue/digital conversion means comprising:
　a comparator for receiving an analogue signal from an integration capacitor and for providing a two-states output signal capable of adopting, according to the analogue signal, a first state called the "stable state" or a second state,
　charge injector means formed by a plurality of charge injectors, for modifying the analogue signal by at least one injection of a given quantity of charge into the capacitor following a change of state at the output of the comparator, from the first state to the second state, command means for the charge injector means, wherein the command means are for modulating the given quantity of charge according to the intensity of said current, means forming a monostable for:

identifying at least one change of state of the signal at the output of the comparator, from the first state to the second state, emitting to the command means, following said change of state, one or more injection trigger orders as long as the signal at the output of the comparator remains in the second state.

22. A microelectronic device according to claim 21, the command means being adapted to receive the analogue signal, wherein command means are provided to adapt the quantity of charge to be injected during at least one given charge injection, at least according to a frequency of charge injections made prior to said given charge injection.

23. A microelectronic device according to claim 21, in which the command means are adapted to receive the analogue signal, wherein the command means are provided to adapt the quantity of charge designed to be injected during at least one given charge injection, at least according to the minimum level of the analogue signal.

24. A microelectronic device of claim 22, in which command means are provided moreover so that: if the number of trigger orders reaches a predetermined threshold while the signal at the output of the comparator remains in the second state, said command means increase the quantity of charge for at least one following charge injection.

25. A microelectronic image sensor device of claim 21, in which command means are provided moreover so that: if the given number of trigger orders following said change of state is less than or equal to a predetermined threshold when the signal at the output of the comparator switches back to the first state, said command means reduce the quantity of charge injected for at least one following charge injection.

26. A method for commanding a microelectronic device comprising at least one detector, at least one integration capacitor associated to the detector and adapted to provide at least one analogue signal capable of varying at least according to a current provided by the detector, the method comprising the steps of:

comparing the analogue signal to a predetermined reference and providing a signal in two states representative of the comparison and capable of adopting a first state called the "stable state" or a second state, detecting, in said signal in two states, a transition from the first state to the second state, injecting, following said detection, one or more quantities of charges Qc into the integration capacitor, making at least one estimation of the current provided by the detector, comparing the result of said estimation to at least one predetermined threshold, injecting, following said comparison, one or more new given quantities of charges Qc into the capacitor, wherein said new given quantity or quantities of charges Qc have been adapted according to the result of said comparison step.

27. A method according to claim 26, wherein said estimation of the current provided by the detector is made at least according to a frequency of charge injections Qc.

28. A method according to claim 26, wherein said estimation is made at least according to the minimum level of the analogue signal.

29. A method according to claim 26, comprising moreover, following said change of state:

the emission, in the form of another signal in two states, of one or more charge injection trigger orders as long as said signal in two states at the output of the comparator remains in the second state, wherein said estimation of the current provided by the detector is made at least using the countdown of the number of trigger orders emitted.

30. A method according to claim 26, in which if the number of trigger orders reaches a predetermined threshold while the signal at the output of the comparator remains in the second state, said method comprising moreover: an increase in the quantity of charge for at least one following charge injection.

31. A method of claim 26, in which, if the given number of trigger orders following said change of state is less than or equal to a predetermined threshold when the signal at the output of the comparator switches back to the first state, the method comprises moreover: a reduction of the quantity of charge injected for at least one following charge injection.

* * * * *